(12) United States Patent
Usami

(10) Patent No.: US 9,418,907 B2
(45) Date of Patent: Aug. 16, 2016

(54) METHOD FOR MANUFACTURING SEMICONDUCTOR DEVICE

(71) Applicant: PS5 Luxco S.a.r.l., Luxembourg (LU)

(72) Inventor: Sensho Usami, Tokyo (JP)

(73) Assignee: PS5 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/762,320

(22) PCT Filed: Jan. 17, 2014

(86) PCT No.: PCT/JP2014/050756
§ 371 (c)(1),
(2) Date: Jul. 21, 2015

(87) PCT Pub. No.: WO2014/115644
PCT Pub. Date: Jul. 31, 2014

(65) Prior Publication Data
US 2015/0357251 A1    Dec. 10, 2015

(30) Foreign Application Priority Data
Jan. 22, 2013    (JP) ................................. 2013-009285

(51) Int. Cl.
*H01L 21/66* (2006.01)
*H01L 21/311* (2006.01)
(Continued)

(52) U.S. Cl.
CPC .............. *H01L 22/20* (2013.01); *H01L 21/311* (2013.01); *H01L 21/561* (2013.01); *H01L 21/78* (2013.01); *H01L 23/00* (2013.01); *H01L 23/3128* (2013.01); *H01L 23/562* (2013.01); *H01L 24/97* (2013.01); *H01L 24/73* (2013.01); *H01L 2223/54486* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/97* (2013.01); *H01L 2924/15311* (2013.01); *H01L 2924/15331* (2013.01); *H01L 2924/181* (2013.01);
(Continued)

(58) Field of Classification Search
CPC ..... H01L 22/20; H01L 21/561; H01L 21/311; H01L 21/78; H01L 24/97; H01L 23/562
See application file for complete search history.

(56) References Cited

U.S. PATENT DOCUMENTS 6,080,602 A    6/2000  Tani et al.
8,632,714 B2 *  1/2014  Ogino ................... B81C 1/0046
                                                                            264/293
(Continued)

FOREIGN PATENT DOCUMENTS

JP    2002100702    4/2002
JP    2012169398    6/2012

OTHER PUBLICATIONS

Application No. PCT/JP2014/050756, International Search Report, Mar. 18, 2014.

*Primary Examiner* — Savitr Mulpuri
(74) *Attorney, Agent, or Firm* — Kunzler Law Group, PC

(57) ABSTRACT

A sample semiconductor device is manufactured and the curvature of the sample is measured. An area is set to be removed from an encapsulation resin layer on the basis of the measurement value. After forming the encapsulation resin layer during the process of manufacturing the semiconductor device, the removal area is removed.

6 Claims, 17 Drawing Sheets

(51) Int. Cl.
*H01L 21/78* (2006.01)
*H01L 23/00* (2006.01)
*H01L 23/31* (2006.01)
*H01L 21/56* (2006.01)

(52) U.S. Cl.
CPC . *H01L2924/1815* (2013.01); *H01L 2924/3511* (2013.01)

(56) References Cited

U.S. PATENT DOCUMENTS 8,895,326 B2 * 11/2014 Sekiya .................. H01L 22/12
257/E21.503
2012/0251791 A1 10/2012 Kawai

* cited by examiner

METHOD FOR MANUFACTURING SEMICONDUCTOR DEVICE

TECHNICAL FIELD

The present invention relates to the shape of a semiconductor device, and in particular the present invention relates to restricting an increased profile height due to curvature caused by differences in thermal expansion coefficient among members forming a semiconductor device.

BACKGROUND

BGA (Ball Grid Array) semiconductor devices are generally constructed in such a way that a semiconductor chip is mounted on one surface of a wiring board, and that surface of the wiring board is covered by a sealing resin so that the semiconductor chip is covered, as described in Patent Document 1, for example.

The wiring board, semiconductor chip and sealing resin forming a semiconductor device normally have different thermal expansion coefficients. Curvature is produced in the semiconductor device due to the difference in thermal expansion coefficients. In a semiconductor device in which convex curvature has been produced, the central part projects from the surrounding part, whereas in a semiconductor device in which concave curvature has been produced, the surrounding part projects from the central part. In either case, the actual semiconductor device which has curved due to the difference in thermal expansion coefficients of the constituent members has regions which project to a greater extent than a semiconductor device in an ideal state without any curvature. The presence of these projections acts in a direction which increases the overall height of the semiconductor device and is a factor in substantially increasing the profile height of the semiconductor device.

There has been a demand for thinner and more compact portable devices etc. in recent years, and the semiconductor devices incorporated in such devices also have to be thinner and more compact. Under these circumstances, if a large amount of curvature is produced in a semiconductor device, the overall height of the semiconductor device after mounting increases and as a result a situation arises in which the semiconductor device can no longer be incorporated into a portable device and the production yield deteriorates.

By making the thermal expansion coefficients of the constituent members of the semiconductor device as close as possible to one another it is possible to restrict the magnitude of curvature to a certain extent. However, there are limits to this and so there are constraints on the combination of materials in semiconductor devices.

Patent Document 2 may be cited as a document describing an invention associated with the present invention. That document describes a technique in which four locations at the corners of a semiconductor device are endowed with a recessed shape in order to prevent cracking and chipping at the corners of the semiconductor device. That document does not take account of curvature of the semiconductor device. Furthermore, a new step is added in that document in order to form recesses in a sealing resin.

Patent Documents 1 and 2 are cited as documents describing technology relating to the present invention.

Patent Documents

Patent Document 1: JP 2012-169398 A
Patent Document 2: JP 2002-100702 A

SUMMARY OF THE INVENTION

Problem to be Solved by the Invention

The present invention has been devised in view of the situation described above, and the problem to be solved by the present invention lies in preventing an increased profile height in a semiconductor device as a result of part of the semiconductor device projecting due to shape distortion such as curvature produced in the semiconductor device.

Means for Solving the Problem

In order to solve the abovementioned problem, one mode of the present invention provides a method for manufacturing a semiconductor device, characterized in that it comprises the following stages: a sample manufacturing stage in which a sample semiconductor device is manufactured; a sample measurement stage in which a measurement value relating to curvature of the sample is taken; a removal region determination stage in which a removal region constituting a region for removal from a sealing resin layer covering one surface of the semiconductor device positioned on the opposite side of a substrate when the semiconductor device is mounted on said substrate is determined in accordance with the measurement value; and a manufacturing stage which is a stage in which the semiconductor device is manufactured, comprising a step in which the sealing resin layer is formed, after which the removal region is removed.

Advantage of the Invention

According to the present invention, a removal region including a region projecting from a semiconductor device is determined and removed in accordance with a measurement result of a sample semiconductor device, and therefore it is possible to prevent an increased profile height of the semiconductor device which would occur if a projecting region were left in place.

MODE OF EMBODIMENT OF THE INVENTION

The method for manufacturing a semiconductor device according to a mode of embodiment of the present invention will be described. According to the inventive manufacturing method, a sample of a semiconductor device is manufactured prior to the manufacture of the semiconductor device serving as the final target product, and the sample is measured in order to acquire measurement values relating to the magnitude and direction of curvature. Curvature causes the surface of the sample semiconductor device mounted on a substrate, to be more specific part of a sealing resin layer, to extend beyond a predetermined reference surface. If the region beyond the reference surface is referred to as a "projecting region", then according to this method, a region including the projecting region of the sealing resin layer is determined to be a removal region which is removed in the process of manufacturing the semiconductor device serving as the product.

Figure 1:
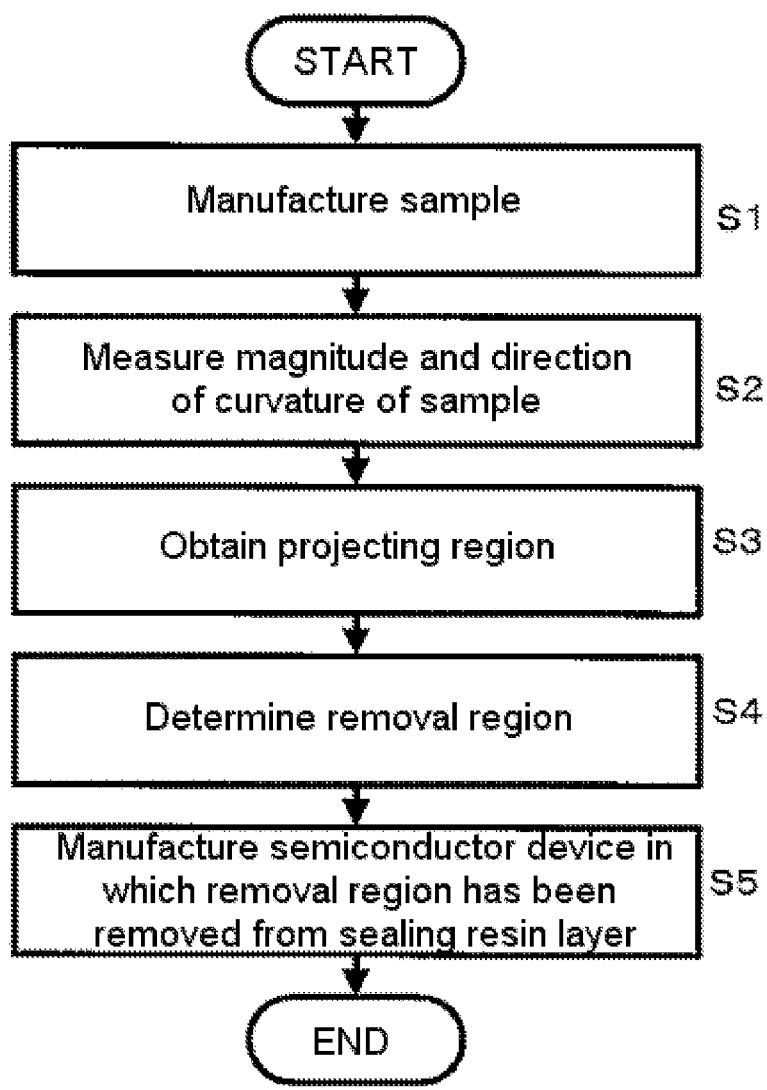
FIG. 1 is a flowchart for illustrating the method for manufacturing a semiconductor device according to the present invention.
Figure 2:
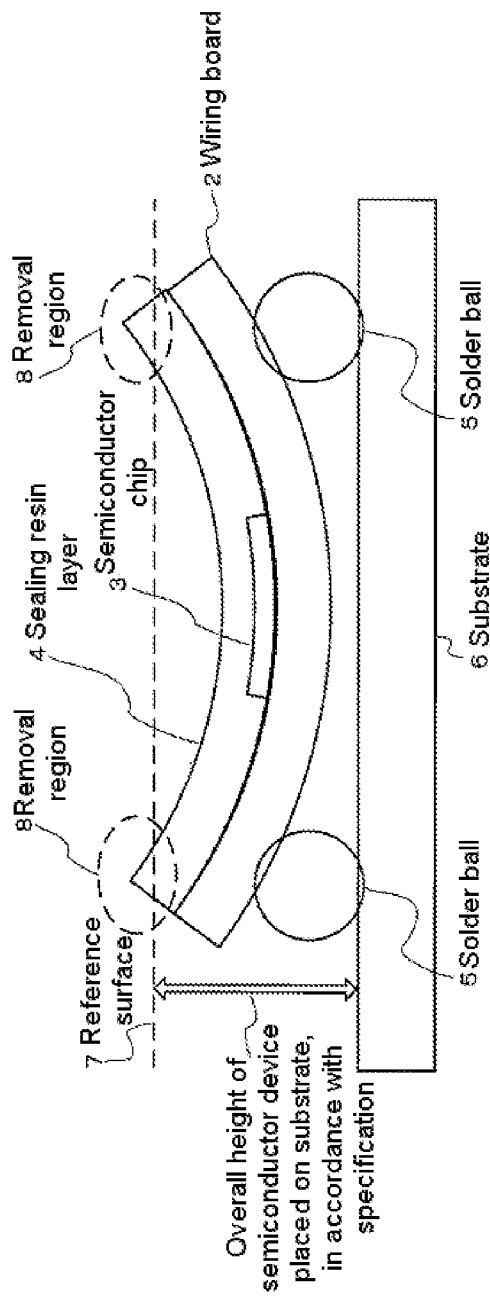
FIG. 2 is a diagram to illustrate a sample 1 curved into a concave shape, which is manufactured prior to manufacture of the semiconductor device serving as the final target article by the method for manufacturing a semiconductor device according to the present invention.

Referring to FIG. 1, a sample semiconductor device is manufactured prior to the manufacture of the semiconductor device which is manufactured as the final product (step S1). As shown in FIG. 2, a sample 1 comprises: a wiring board 2, a semiconductor chip 3 which is mounted on the wiring board 2, a sealing resin layer 4 for covering the wiring board 2 and the semiconductor chip 3, a substrate 6 for mounting the wiring board 2, and solder balls 5 for joining the wiring board 2 and the substrate 6. The method for manufacturing the sample 1 is the same as the method for manufacturing a conventional semiconductor device. The wiring board 2, semiconductor chip 3 and sealing resin layer 4 are made of different materials, so the thermal expansion coefficients thereof are also different. Concave curvature is produced in the sample 1 on the substrate 6, as shown in FIG. 2, as a result of this difference in thermal expansion coefficient and of the size and shape etc. of the wiring board 2 semiconductor chip 3 and sealing resin layer 4. In FIG. 2 the actual curvature of a semiconductor device has been exaggerated in order to aid an understanding of the present invention.

The magnitude and direction etc. of the curvature and values relating to the curvature are then measured by actually measuring the sample 1 (step S2).

Figure 3:
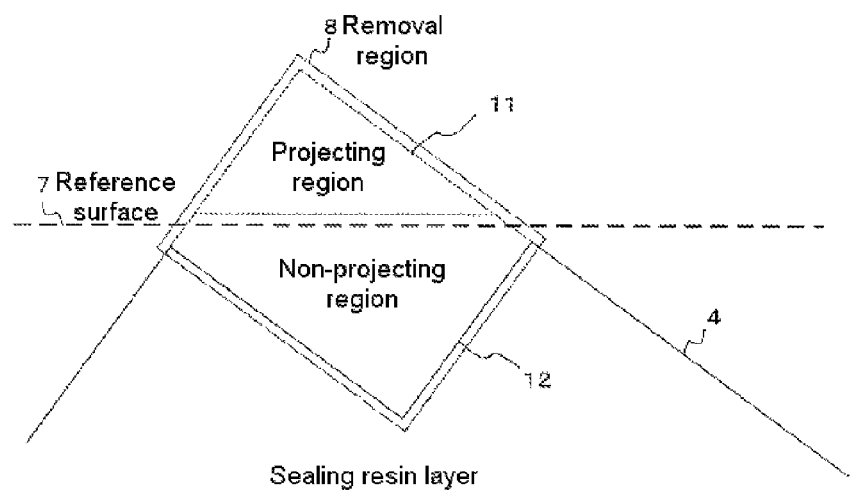
FIG. 3 is a diagram to illustrate an example of a removal region 8.
Figure 4:
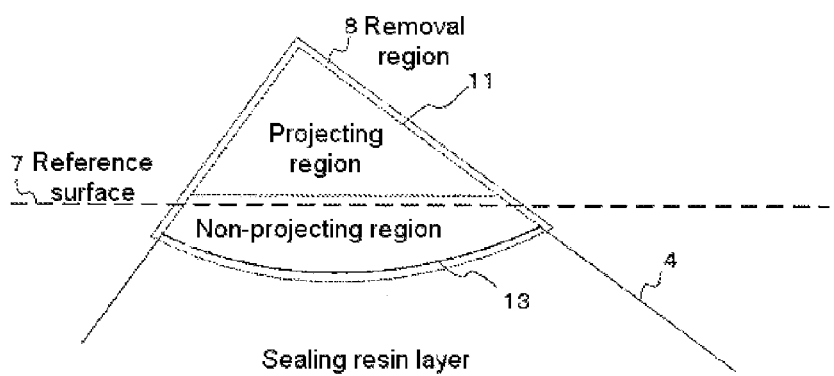
FIG. 4 is a diagram to illustrate an example of a removal region 8.

The projecting region is then obtained in accordance with the measurement values acquired in step S2 and a predetermined reference surface 7 (step S3). The reference surface 7 constitutes, for example, the height of the semiconductor device from the substrate surface when a semiconductor device constituting the final target article is mounted on the substrate using the solder balls. When concave curvature is produced as with the sample 1, the peripheral edges of the sample 1, and in particular the upper sides of the four corners of the sealing resin layer 4 if the sample is rectangular, as shown in FIG. 3 and FIG. 4, form projecting regions 11 shaped like triangular pyramids.

Removal regions 8 are then determined in accordance with the projecting regions 11 (step S4). The shape of the removal regions 8 should include the projecting regions 11. For example, the removal region 8 in FIG. 3 serves to remove the projecting region 11 from the sealing resin layer 4 as part of an imaginary cylinder in which the oblique line on the left of the right-angled triangle indicating the projecting region 11 in FIG. 3 constitutes the center axis, and the oblique line on the right of the same right-angled triangle constitutes the radius. Furthermore, the removal region 8 in FIG. 4 serves to remove the projecting region 11 from the sealing resin layer 4 as part of an imaginary sphere having a center on the line of extension of the oblique line on the left of the right-angled triangle indicating the projecting region 11 in FIG. 3.

After the removal regions 8 have been determined in this way, the semiconductor device serving as the final product is manufactured. The removal regions 8 are removed in the manufacturing process (step S5).

Figure 5:
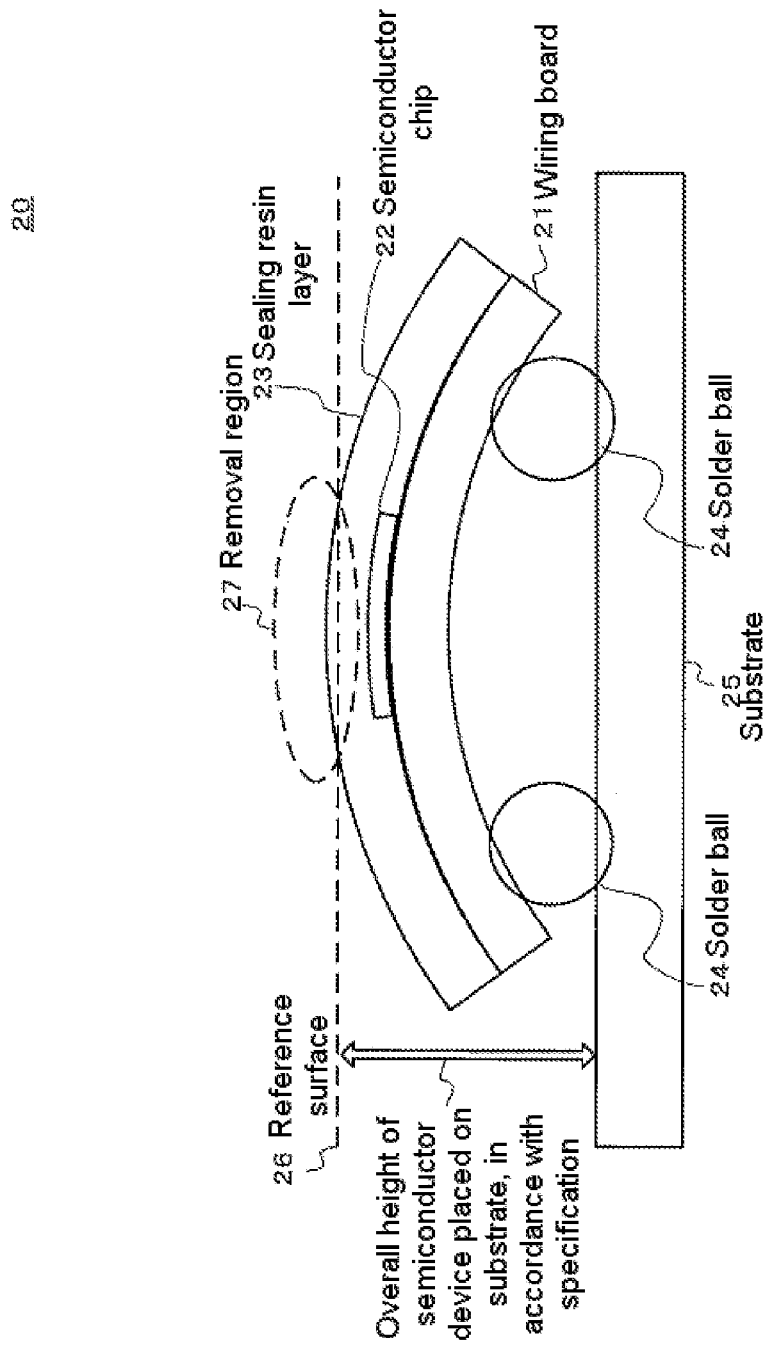
FIG. 5 is a diagram to illustrate a sample 20 curved into a convex shape, which is manufactured prior to manufacture of the semiconductor device serving as the final target article by the method for manufacturing a semiconductor device according to the present invention.
Figure 6:
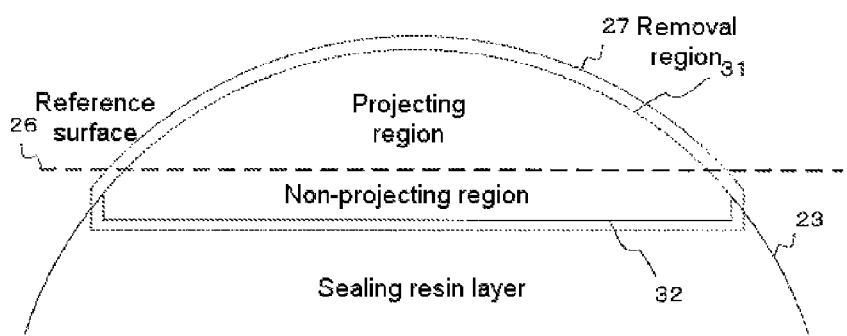
FIG. 6 is a diagram to illustrate an example of a removal region 27.
Figure 7:
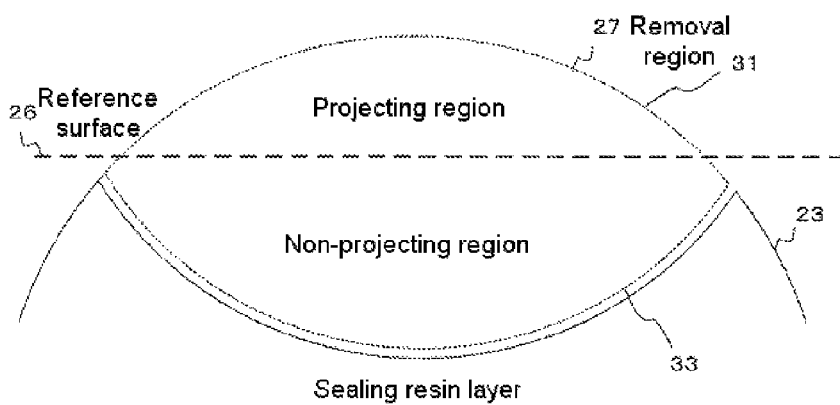
FIG. 7 is a diagram to illustrate an example of a removal region 27.

The abovementioned description relates to a case in which the semiconductor device is curved in a concave shape, but the present invention may equally be applied if the semiconductor device is curved in a convex shape. As shown in FIG. 5, a sample 20 is curved in a convex shape. In the same way as with the sample 1, the sample 20 comprises a wiring board 21, a semiconductor chip 22, a sealing resin layer 23, solder balls 24 and a substrate 25. The sample 20 follows a convex shape, so the center thereof is higher than a reference surface 26. A removal region 27 should have a shape that includes a projecting region 31, and as shown in FIG. 6, the removal region 27 may serve to remove part of the sealing resin layer 23 in the shape of a cylinder including the projecting region 31, or as shown in FIG. 7, the removal region 27 may serve to remove part of the sealing resin layer 23 as part of a sphere including the projecting region 31, for example.

Exemplary Embodiment 1

Figure 8:
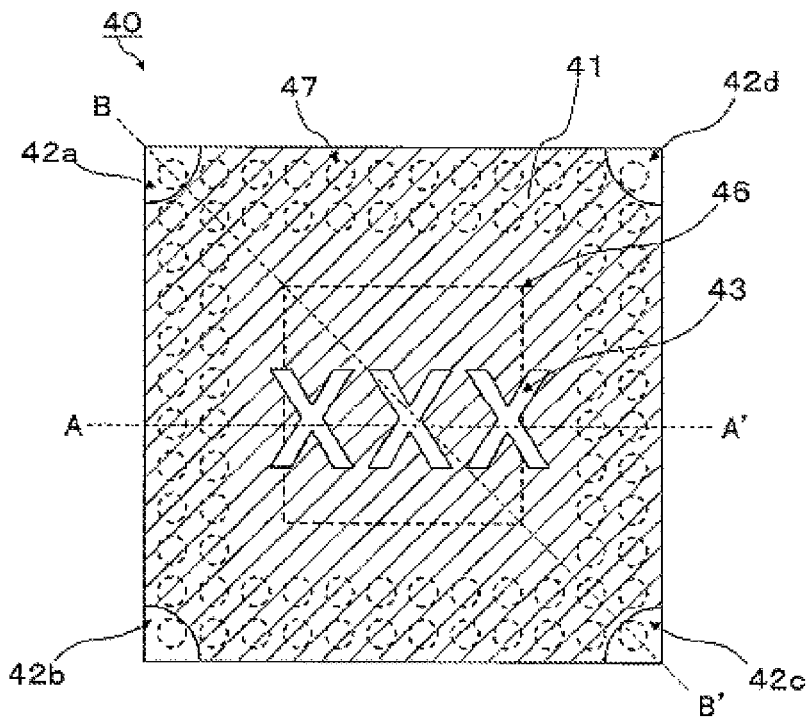
FIG. 8 is a plan view showing the schematic configuration of a semiconductor device 40 according to Exemplary Embodiment 1.

The semiconductor device 40 shown in FIG. 8 will be described as Exemplary Embodiment 1. The semiconductor device 40 is manufactured in accordance with the abovementioned method for manufacturing a semiconductor device and corresponds to a sample 1 having concave curvature. As shown in FIG. 8, when the semiconductor device 40 is viewed from above while mounted on a substrate which is not depicted, first recesses 42*a*, 42*b*, 42*c*, 42*d* are formed at the four corners of the surface of a sealing resin layer 41 covering the surface of the semiconductor device 40 and correspond to the abovementioned removal regions 8. Furthermore, a second recess 43 constituting an identification mark, such as a company name or product name ("XXX" is given as an example in the figure) is formed in a substantially central position of the sealing resin layer 41. The semiconductor device 40 is mounted on a substrate which is not depicted with the interposition of solder balls which are arranged at the positions of the circles drawn in dotted lines in the figure.

Figure 9:
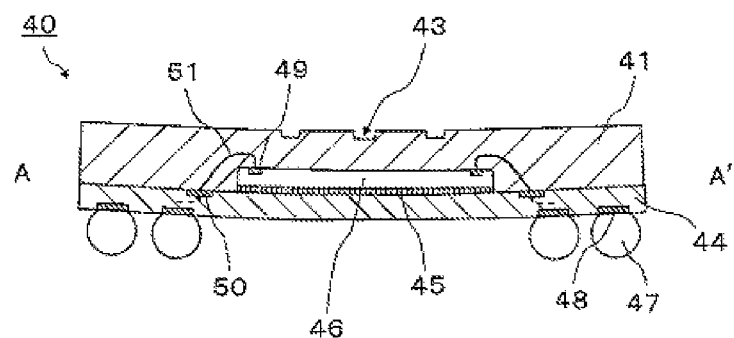
FIG. 9 is a view in cross section showing the schematic configuration between A-A' in FIG. 8.
Figure 10:
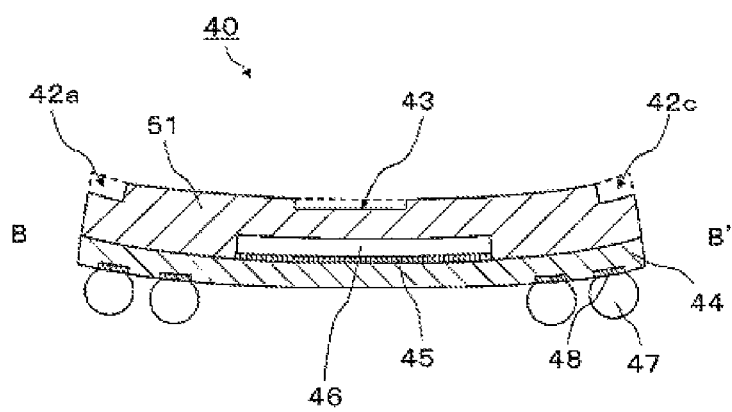
FIG. 10 is a view in cross section showing the schematic configuration between B-B' in FIG. 8.

As shown in the cross section A-A in FIG. 9 and the cross section B-B in FIG. 10, the semiconductor device 40 has a structure in which a semiconductor chip 46 bonded by an adhesive member 45 to a wiring board 44 is covered by the sealing resin layer 41. The semiconductor chip 46 is a memory chip, for example. Lands 48 arranged correspondingly with solder balls 47 are provided on the lower surface of the wiring board 44. The areas between electrode pads 49 of the semiconductor chip 46 and connection pads 50 of the wiring board 44 are connected by wires 51.

As is clear from FIG. 9 and FIG. 10, the semiconductor device 40 has concave curvature. As shown in FIG. 10, the curvature on the diagonals of the wiring board 44 in particular is larger than in the other directions, and the height is at a maximum at positions corresponding to the four corners of the sealing resin layer 41. When there is concave curvature as with the semiconductor device 40, the first recesses 42a-42d are therefore formed at the four corners of the sealing resin layer 41, and as a result it is possible to reduce the maximum height of the semiconductor device 40. The first recesses 42a-42d are formed to a greater depth than the second recess 43. For example, the first recesses 42a-42d are formed to a depth of 10-60 μm and the second recess 43 is formed to a depth of 5-30 μm.

According to Exemplary Embodiment 1, the semiconductor device 40 has concave curvature and the overall height of the semiconductor device can be reduced by forming the first recesses 42a-42d at the highest points on the surface of the sealing resin layer 41, so the overall height after mounting can also be reduced. Furthermore, the amount of curvature can be reduced by reducing the amount of resin at the corners of the sealing resin layer 41. In addition, when the semiconductor device 40 is mass produced, it is possible to restrict fluctuations in curvature among individual semiconductor devices 40. As a result, the incidence of mounting defects when the semiconductor device 40 is incorporated into another device such as a portable information processor can be reduced and the assembly yield can be improved.

It should be noted that the second recess 43 is preferably formed on the surface avoiding positions directly above the wires 51 connecting the semiconductor chip 46 and the wiring board 44, as shown in FIG. 9. By forming the second recess 43 in such a position, it is possible to prevent the wires 51 from becoming exposed from the sealing resin layer 41 when the mark is formed by laser marking.

Figure 11:
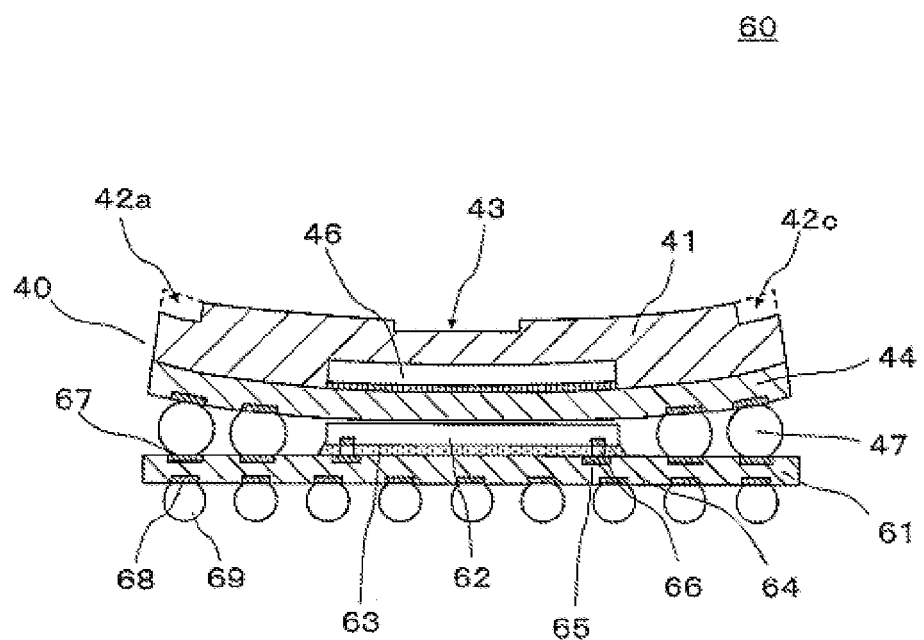
FIG. 11 is a view in cross section showing a structure in which the semiconductor device 40 according to Exemplary Embodiment 1 is stacked as a package on another semiconductor device.

As shown in FIG. 11, the semiconductor device 40 may be stacked on another semiconductor device 60. In the semiconductor device 60, the gap between a wiring board 61 and a semiconductor chip 62 is filled with an underfill material 63. The semiconductor chip 62 is a logic chip, for example, and the semiconductor chip 62 is flip-chip mounted on the wiring board 61. The electrode pads 64 of the semiconductor chip 62 and connection pads 65 of the wiring board 61 are connected by way of bumps 66. Connection lands 67 are provided on the upper surface of the wiring board 61. The solder balls 47 are formed between the lands 48 of the semiconductor device 40 and the connection lands 67 of the semiconductor device 60. Lands 68 are further provided on the lower surface of the wiring board 61. The semiconductor device 60 (and the semiconductor device 40 mounted thereon) are mounted on another wiring board which is not depicted by forming solder balls 69 below the lands 68.

Unlike the semiconductor device 40, a sealing resin layer is not formed on the semiconductor device 60, so there is less curvature than with the semiconductor device 40. As shown in FIG. 11, the semiconductor device 40 having a large amount of curvature is mounted on the semiconductor device 60 having a small amount of curvature. The diameter of the solder balls 47 is therefore preferably at least equal to the mounting height of the semiconductor chip 62 when the semiconductor device 40 is mounted.

Figure 12:
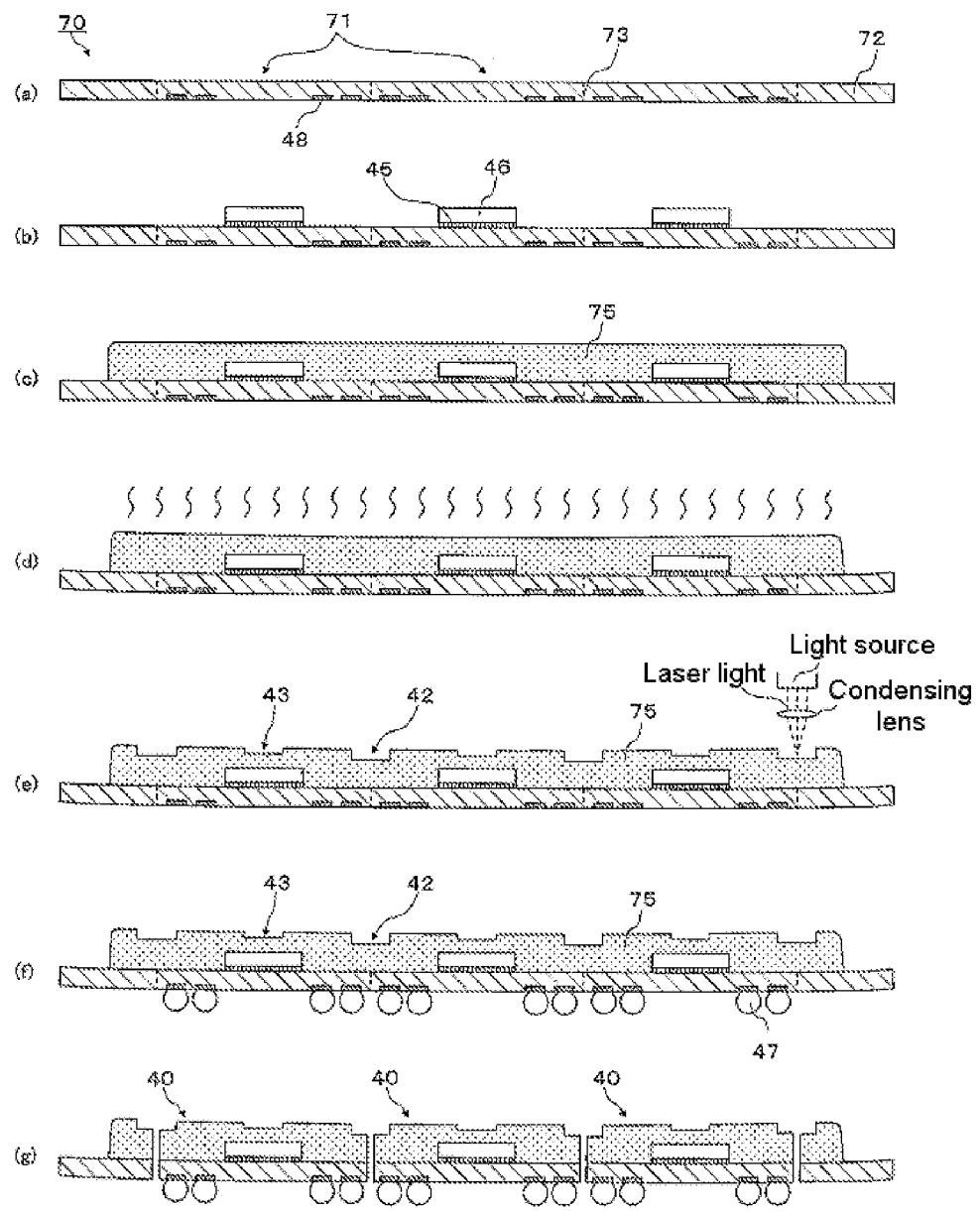
FIG. 12 is a diagram to illustrate an example of the method for manufacturing the semiconductor device 40.

The method for manufacturing the semiconductor device 40 will be described next with reference to FIG. 12.

Figure 13:
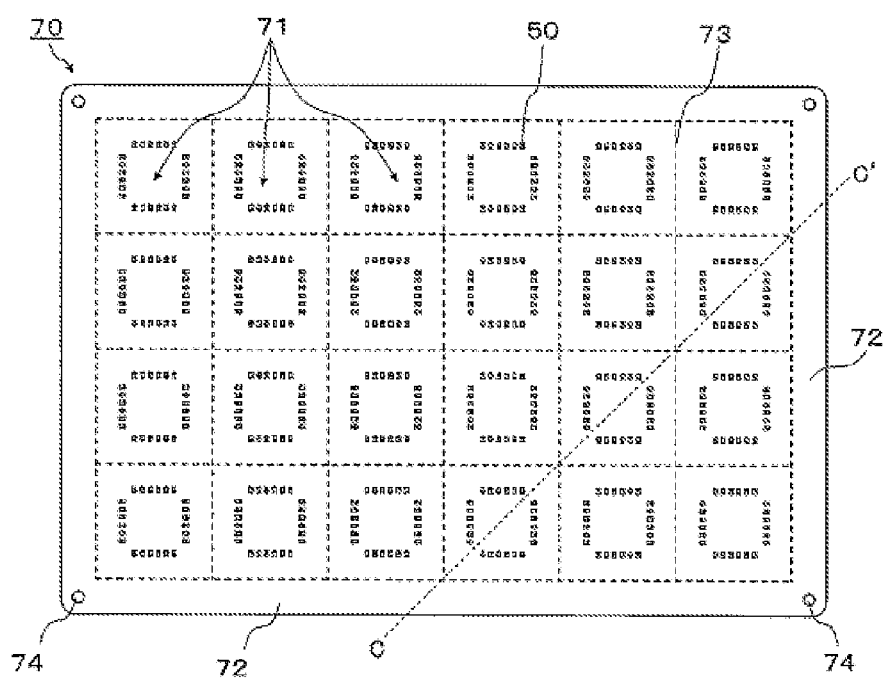
FIG. 13 is a diagram of a wiring motherboard 70 in the step in FIG. 12(*a*), seen looking down from above.

A wiring motherboard 70 such as that shown in FIG. 12(a) is first of all prepared. In the following description, the upper surface refers to the surface of the wiring motherboard 70 on the side on which the semiconductor chips are mounted, while the lower surface refers to the surface on the opposite side on which the solder balls are mounted. The wiring motherboard 70 comprises a frame section 72 and product formation regions 71 corresponding to each individual semiconductor device. Dicing lines 73 are established between product formation regions 71 and between the product formation regions 71 and the frame section 72. The lands 48 are formed on the lower surface of the wiring motherboard 70. FIG. 13 shows the upper surface of the wiring motherboard 70 at this point from above. The upper surface of the wiring motherboard 70 is divided into 4×6 rectangular product formation regions 71 by means of the dicing lines 73. Connection pads 50 are formed in each of the product formation regions 71. Positioning holes 74 are provided in the frame section 72.

Figure 14:
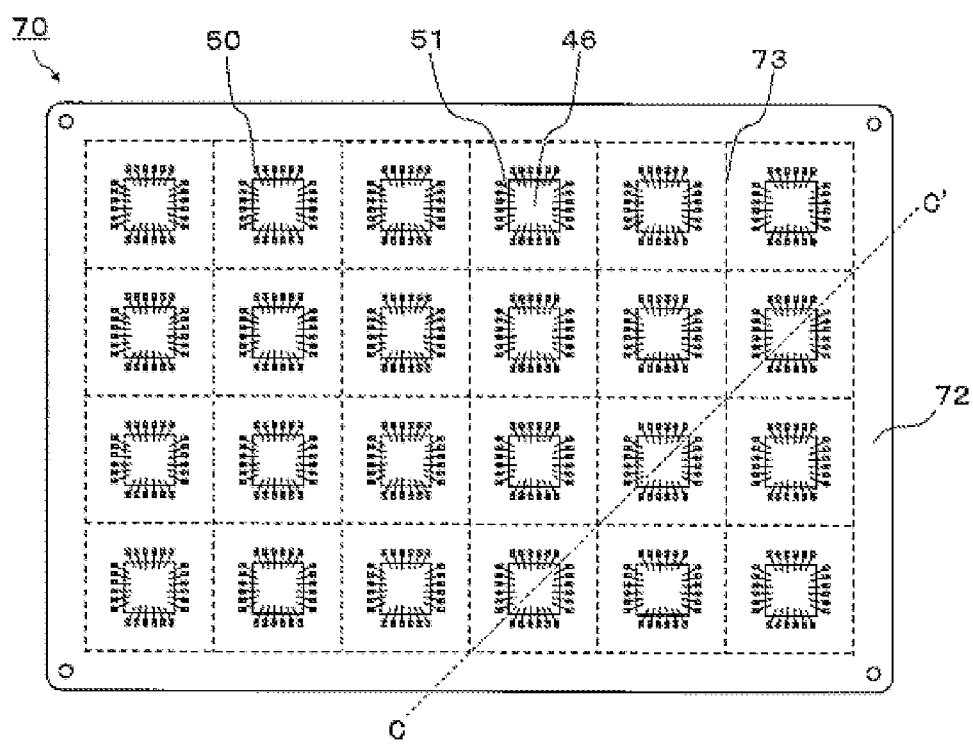
FIG. 14 is a diagram of the wiring motherboard 70 in the step in FIG. 12(*b*), seen looking down from above.

An adhesive member 45 is then applied to each of the product formation regions 71 and a semiconductor chip 46 is mounted thereon, as shown in FIG. 12(b). The electrode pads 49 and connection pads 50 are connected by the wires 51 in each semiconductor chip. FIG. 14 shows the upper surface of the wiring motherboard 70 at this point from above.

Next, as shown in FIG. 12(c), the upper surface side of the wiring motherboard 70 is covered with a sealing resin layer 75 in which a heat-curable epoxy resin or the like has been pressurized and melted, and this layer is reacted and cured by means of heating or the like, as shown in FIG. 12(d).

The mark-forming step is carried out next. In the mark-forming step, the surface of the sealing resin layer 75 is marked using a laser marking device, for example, as shown in FIG. 12(e), and the first recesses 42a-42d and the second recess 43 are formed all together as a result. Hereafter, the first recesses 42a-42d will be referred to as the "first recesses 42" when there is no need to distinguish them.

A YVO4 (yttrium vanadium oxide) laser is used as the laser for the laser marking device. The resin surface of the sealing resin layer 75 is irradiated with laser light and the resin surface is scraped away by around 5-30 μm; as a result, the unevenness produced by the scraping away produces diffuse reflection and the mark can be identified by the contrast with the molded resin surface. The required recess can be formed in the surface of the sealing resin layer 75 by irradiating the sealing resin layer 75 with laser light through a mask having a predetermined pattern, or by drawing a predetermined pattern on the sealing resin layer 75 using laser light.

Figure 15:
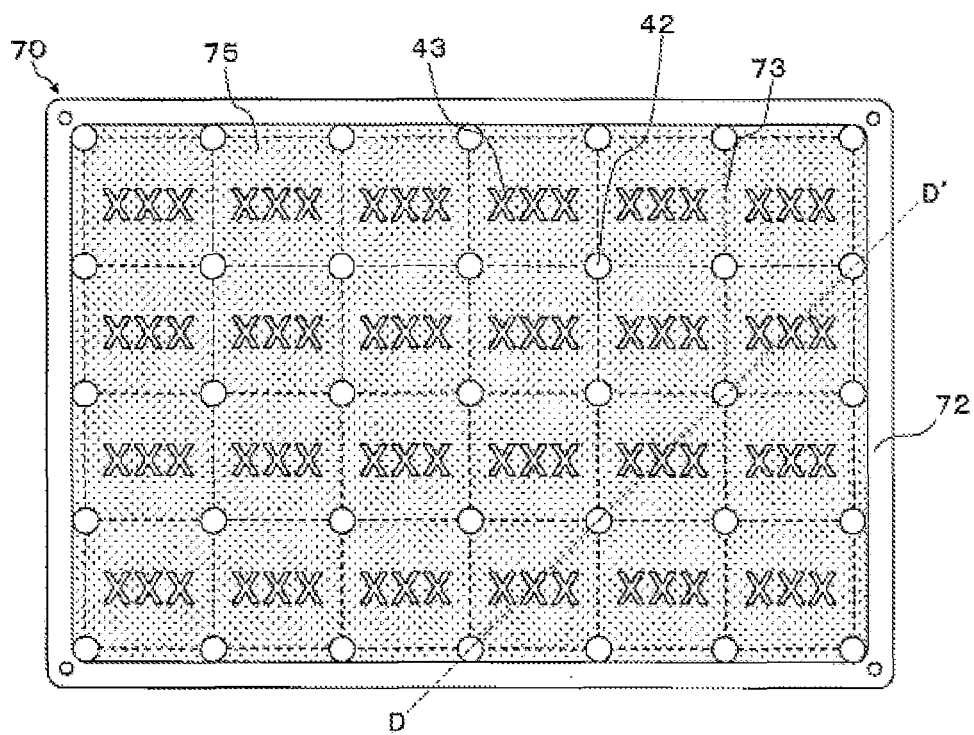
FIG. 15 is a diagram of the wiring motherboard 70 in the step in FIG. 12(*e*), seen looking down from above.

As shown in FIG. 15, the first recesses 42 are formed as substantially circular recesses by means of laser marking at the positions of intersection of the dicing lines 73 defining the product formation regions 71 on the wiring motherboard 70. The first recesses 42 are deeper than the second recess 43 and are formed in such a way as to have depth of the order of 10-60 μm, for example.

Furthermore, in the mark-forming step, an identification mark such as a company name or product name etc. is formed as the second recess 43 in each of the plurality of product formation regions 71 on the wiring motherboard 70 at the same time as the first recesses 42 are formed. The second recess 43 is formed by grinding the surface of the sealing resin layer 41 of the individual semiconductor devices 40 by means of laser marking. In view of this, the structure below the second recess 43 is preferably taken into account for determining the position in which the second recess 43 is formed. For example, the second recess 43 is preferably formed to avoid a position above the wires 51 on the surface of the sealing resin layer 41 in order to take account of the fact that the wiring board 44 and the semiconductor chip 46 are connected by wires 51. By this means, the resin surface is ground by means of laser marking, and as a result it is possible to avoid exposure of the wires 51 from the surface of the sealing resin layer 41.

The solder balls 47 are then mounted on the lands 48 on the lower surface of the wiring motherboard 70, as shown in FIG. 12(f).

Finally, in the substrate dicing step, as shown in FIG. 12(g), the sealing resin layer 75 is bonded to dicing tape, whereby the sealing resin layer 75 and the wiring motherboard 70 are supported by the dicing tape. After this, the wiring motherboard 70 and the sealing resin layer 75 are cut vertically and horizontally along the dicing lines 73 using a dicing blade in order to separate the structure into individual product formation regions 71, and individual semiconductor devices 40 are obtained as a result.

As shown in FIG. 8, an identification mark is formed as the second recess 43 in substantially the center of the surface of the sealing resin layer 41 of the semiconductor device 40 manufactured in this way, and arc-shaped recesses which are deeper than the second recess 43 and constitute one quarter of a circumference are formed as the first recesses 42 at the four corners of the surface of the sealing resin layer 41.

When concave curvature is produced—with the center of the semiconductor device 40 being depressed and the surrounding part being raised for reasons including the difference in thermal expansion coefficient of the sealing resin layer 41, semiconductor chip 46 and wiring board 44—curvature is produced in such a way that the four corners are the highest when the semiconductor substrate 40 is mounted on a substrate or the like, but the raised portions are ground as the first recesses 42, so it is possible to prevent the overall height of the semiconductor device from increasing due to concave curvature.

Furthermore, the first recesses 42 are formed all together when the second recess 43 is formed in the mark-forming step. The second recess 43, i.e. the identification mark, is formed in a step which is also carried out in the manufacture of a conventional semiconductor device. This means that there is no need to add a new step simply with the aim of forming the first recesses 42, and the first recesses 42 can be formed simply by modifying part of an existing step.

Exemplary Embodiment 2

A semiconductor device 80 constituting Exemplary Embodiment 2 of the present invention will be described. In Exemplary Embodiment 1 described above, cylindrical recesses having a quarter of an arc as the bottom surface were formed as the first recesses 42 at the four corners of the surface of the semiconductor device 40 having concave curvature. The semiconductor device 80 according to this exemplary embodiment likewise has concave curvature and corresponds to the sample 1 in the mode of embodiment, but the shape of the first recesses differs.

Figure 16:
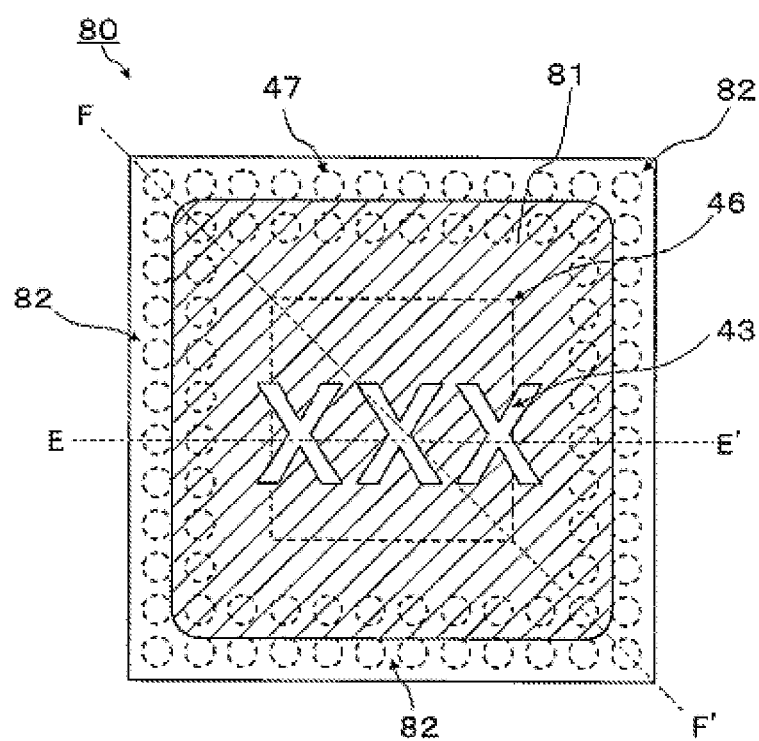
FIG. 16 is a plan view showing the schematic configuration of a semiconductor device 80 according to Exemplary Embodiment 2.

As shown in FIG. 16, the first recesses 82 in the semiconductor device 80 are steps formed along the peripheral edge of a sealing resin layer 81. The recesses 42a-42d are formed at the four corners of the sealing resin layer 81 in Exemplary Embodiment 1 and correspond to the removal regions 8 described in the mode of embodiment, but in Exemplary Embodiment 2, recesses are also formed in the straight line portions at the outer periphery of the sealing resin layer 81 in addition to at the four corners of the sealing resin layer 81. The second recess 43, semiconductor chip 46 and solder balls 47 etc. are the same as in Exemplary Embodiment 1 and bear the same reference symbols, and they will not be described again.

Figure 17:
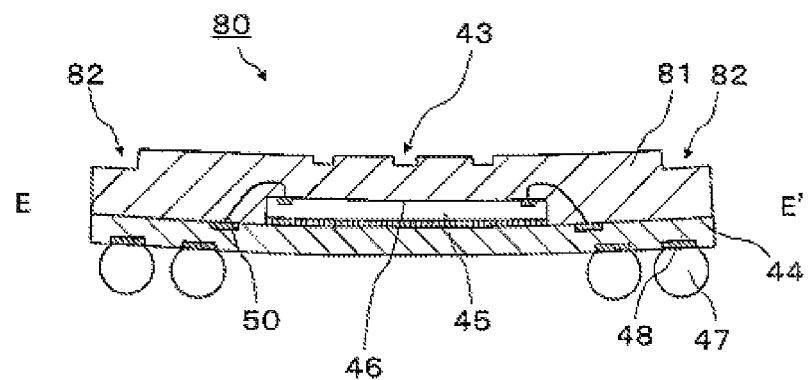
FIG. 17 is a view in cross section showing the schematic configuration between E-E' in FIG. 16.

Here, a comparison of FIG. 9 pertaining to Exemplary Embodiment 1 and FIG. 17 pertaining to Exemplary Embodiment 2 will be described. In Exemplary Embodiment 1, the first recesses 42 are formed only at the four corners, so it is not possible to avoid an increase in the height of the areas on the sides of the sealing resin layer 41 caused by curvature in a direction parallel to the outer peripheral sides of the semiconductor device 40, for example curvature in the direction A-A' in FIG. 8. In contrast to this, in Exemplary Embodiment 2, steps are formed along the outer peripheral sides of the semiconductor device 80, so it is possible to avoid an increase in the height of the areas on the sides of the sealing resin layer 81 caused by curvature in the direction E-E', namely saddle-shaped curvature.

Figure 18:
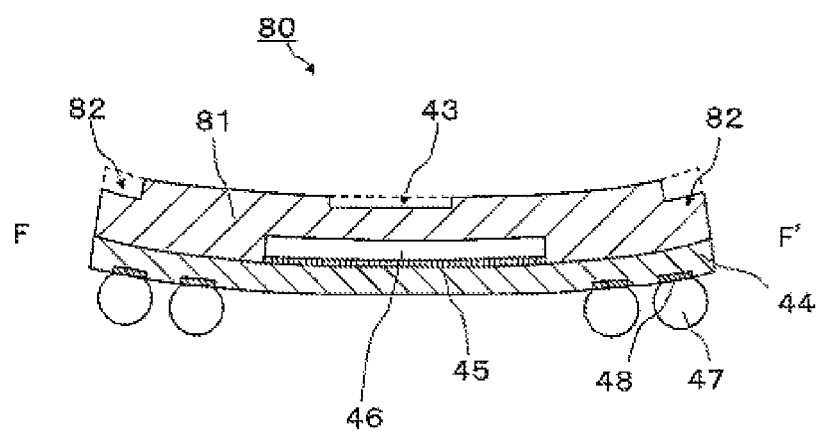
FIG. 18 is a view in cross section showing the schematic configuration between F-F' in FIG. 16.

In addition, as will be understood from a comparison of FIG. 10 pertaining to Exemplary Embodiment 1 and FIG. 18 pertaining to Exemplary Embodiment 2, the semiconductor device 80 also has recesses at the four corners and is in this respect the same as the semiconductor device 40, so it is also possible to avoid an increased profile height with respect to curvature in the direction F-F' in FIG. 16, namely curvature in the direction of the diagonal of the semiconductor device 80, in the same way as in Exemplary Embodiment 1.

It should be noted that the method for manufacturing the semiconductor device 80 is substantially the same as the method for manufacturing a semiconductor device 40. In Exemplary Embodiment 1, the semiconductor device 40 was manufactured by forming circular recesses at the intersections of the dicing lines 73, but in Exemplary Embodiment 2, strip-like recesses are formed along the dicing lines 73 and are not limited to the intersections of the dicing lines 73.

Exemplary Embodiment 3

A semiconductor device 90 constituting Exemplary Embodiment 3 of the present invention will be described. Exemplary Embodiments 1 and 2 are based on a semiconductor device having concave curvature. In contrast to this, the semiconductor device 90 has convex curvature and corresponds to the sample 20 in the mode of embodiment. The height of the central part of a sealing resin layer 91 is relatively higher because of the convex curvature and the height of the surrounding part is relatively lower.

Figure 19:
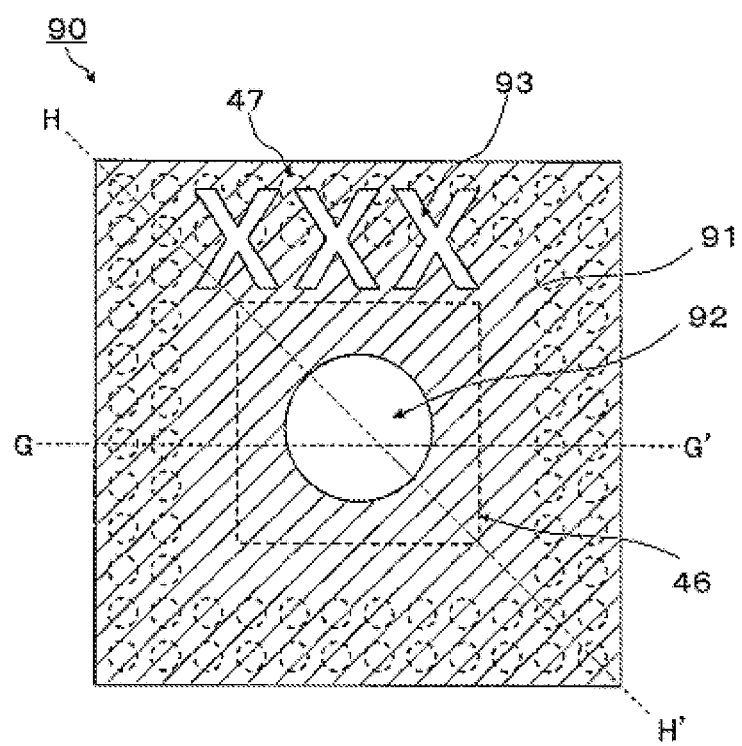
FIG. 19 is a plan view showing the schematic configuration of a semiconductor device 90 according to Exemplary Embodiment 3.
Figure 20:
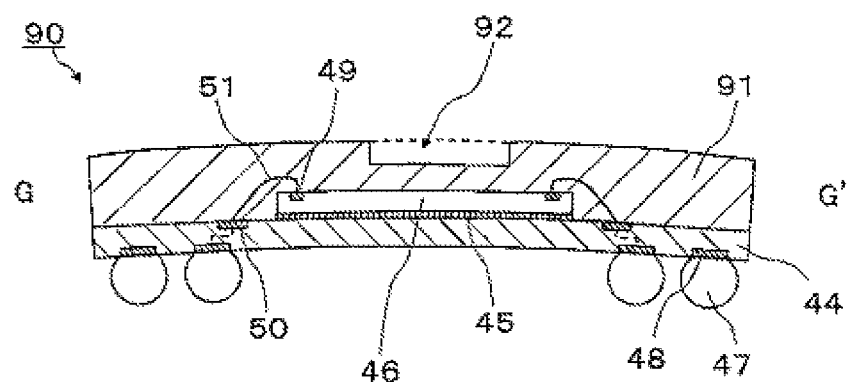
FIG. 20 is a view in cross section showing the schematic configuration between G-G' in FIG. 19.
Figure 21:
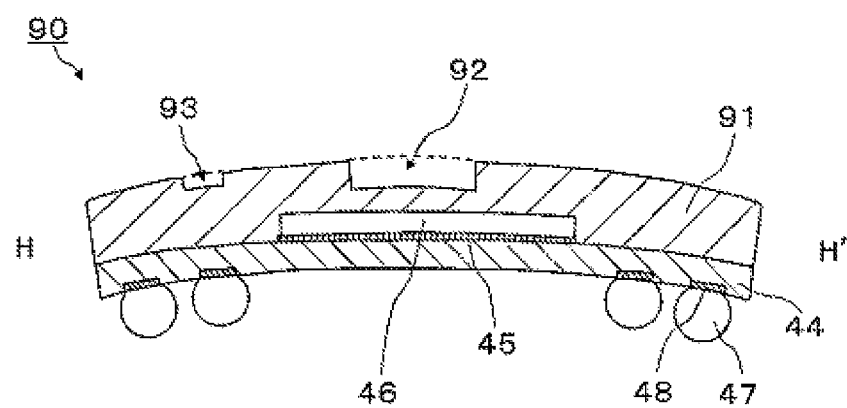
FIG. 21 is a view in cross section showing the schematic configuration between H-H' in FIG. 19.

As shown in FIG. 19, the semiconductor device 90 has first and second recesses in the same way as in Exemplary Embodiments 1 and 2, but the positions of the recesses are different. A first recess 92 is formed in substantially the center of the surface of the sealing resin layer 91 as a recess corresponding to the removal region 8 described in the mode of embodiment. Furthermore, a second recess 93 representing an identification mark or the like of the semiconductor device 90 is formed between an end of the semiconductor device 90 and the first recess 92 on the surface of the sealing resin layer 91. Constituent elements which are the same as in Exemplary Embodiments 1 and 2 bear the same reference symbols and will not be described again. The first recess 92 is preferably formed avoiding the area above the wires 51, as shown in FIG. 20. This is to avoid exposure of the wires 51 from the first recess 92.

The height of the central portion of the sealing resin layer 91 is, by its nature, the greatest due to convex curvature of the sealing resin layer 91, and as a result the height of the semiconductor device 90 is pushed upward; by forming the first recess 92, it is possible to avoid an increased profile height of the semiconductor device 90 caused by convex curvature.

Exemplary Embodiment 4

In the mode of embodiment and the exemplary embodiments described above, a description was given of a semiconductor device having a structure in which a single semiconductor chip is mounted in a single product formation region and covered by a sealing resin layer, but the present invention may equally be applied to a semiconductor device having a structure in which a plurality of semiconductor chips are mounted in a single product formation region and covered by a sealing resin layer. A semiconductor device 100 having a structure in which two semiconductor chips are stacked and mounted in a single product formation region and covered by a sealing resin layer will be described as Exemplary Embodiment 4.

Exemplary Embodiment 4 relates to an example in which the present invention is applied to a semiconductor device having concave curvature in the same way as Exemplary Embodiment 1, but in Exemplary Embodiment 1, a single semiconductor chip 46 is mounted on a wiring board 44, whereas in the semiconductor device 100 according to this exemplary embodiment, an adhesive member 101 is applied to the semiconductor chip 46 and a separate semiconductor chip 102 is further mounted thereon.

Figure 22:
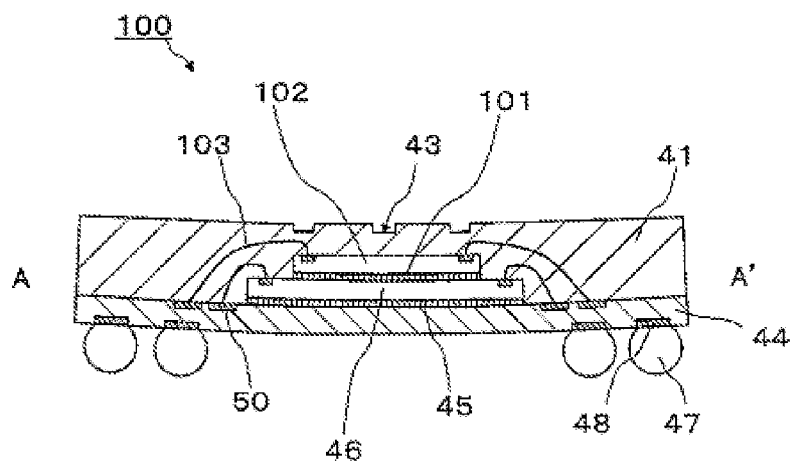
FIG. 22 is a view in the cross section A-A' of a semiconductor device 100 according to Exemplary Embodiment 4.
Figure 23:
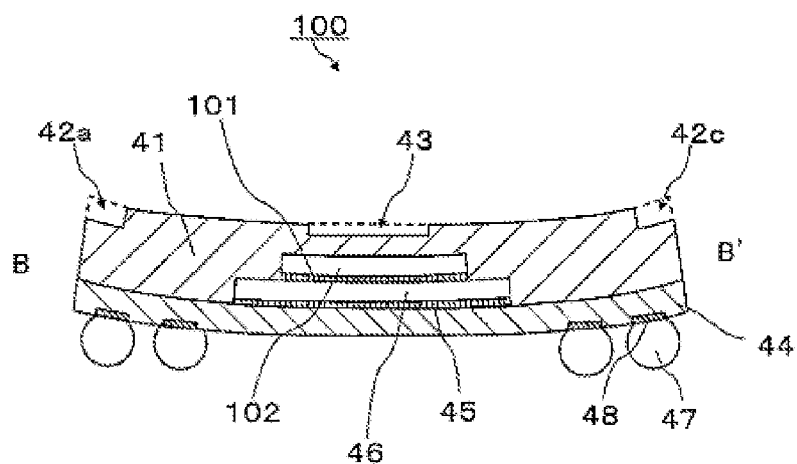
FIG. 23 is a view in the cross section B-B' of the semiconductor device 100 according to Exemplary Embodiment 4.

The appearance of the semiconductor device 100 when seen from above is no different than the semiconductor device 40 shown in FIG. 8. FIG. 22 shows a cross section corresponding to the cross section A-A' in FIG. 8, and FIG. 23 shows a cross section corresponding to the cross section B-B'. As is clear from FIG. 23 in particular, in this exemplary embodiment, an increased profile height of the semiconductor device 100 is prevented by forming the first recesses 42a-42d at the positions having the greatest height as a result of concave curvature produced along the diagonal direction of the semiconductor device 100, i.e. at the four corners of the surface of the sealing resin layer 41.

The invention devised by the present inventor has been described in accordance with exemplary embodiments, but the present invention is not limited to these exemplary embodiments and it goes without saying that various modifications may be made within a scope that does not depart from the essential point of the present invention.

For example, as examples of the removal regions 8 referred to in the mode of embodiment, arc-shaped recesses having a center angle of 90° are formed at the four corners of a semiconductor device by forming circular recesses at intersections of dicing lines and cutting along the dicing lines in a semiconductor device having concave curvature (Exemplary Embodiment 1), strip-like recesses are formed along the four sides of a semiconductor device in such a way as to surround the sides by forming strip-like recesses along dicing lines and cutting along the dicing lines in a semiconductor device likewise having concave curvature (Exemplary Embodiment 2), and a circular recess is formed in substantially the center of a semiconductor device having convex curvature, but the present invention is not limited to these examples. According to one mode of the present invention, when curvature is produced in a semiconductor device because of differences in the thermal expansion coefficients or shapes etc. among the sealing resin layer, semiconductor chip and wiring board, a sample of the semiconductor device is manufactured, the position where the height of the sample is greatest due to curvature is identified, and a portion including that position is ground at the same time as an identification mark is ground, preferably using a laser marking device or the like, and as a result an increased profile height of the semiconductor device which is the final product is prevented. Accordingly, the position in which the first recesses corresponding to the removal regions are formed should include the location or locations which actually have the highest profile when the sample is measured, and the present invention should not be construed as being limited to the shapes or positions described above.

Part or all of the mode of embodiment described above may also be described as in the following additional notes, but the mode of embodiment is not limited thereby.

(Additional Note 1)

A semiconductor device characterized in that it comprises:
a wiring board;
a semiconductor chip mounted on one surface of the wiring board; and
a sealing resin layer formed on said surface of the wiring board in such a way as to cover the semiconductor chip, and the sealing resin layer has a surface on the opposite side to the wiring board and said surface is curved in a predetermined direction, and
a recess is formed in the region constituting the highest point of said surface which is curved in said predetermined direction.

(Additional Note 2)

The semiconductor device as described in Additional Note 1, characterized in that a surface of the sealing resin layer is curved in a concave manner, and
the recess is formed in the region of an end of said surface of the sealing resin layer.

(Additional Note 3)

The semiconductor device as described in Additional Note 1, characterized in that a surface of the sealing resin layer is curved in a convex manner, and
the recess is formed in a region substantially in the center of said surface of the sealing resin layer.

(Additional Note 4)

The semiconductor device as described in Additional Note 2, characterized in that the recess is formed as a single element along an outer edge of the surface of the sealing resin layer.

(Additional Note 5)

The semiconductor device as described in Additional Note 1, characterized in that a mark is formed on the surface of the sealing resin layer, said mark being formed at a position avoiding the recess.

(Additional Note 6)

The semiconductor device as described in Additional Note 5, characterized in that the wiring board and the semiconductor chip are electrically connected by a plurality of wires, and the recess and the mark are formed at positions avoiding a region on the surface of the sealing resin layer positioned above the plurality of wires.

(Additional Note 7)

A semiconductor device characterized in that it comprises:
a wiring board;
a semiconductor chip mounted on one surface of the wiring board;
a sealing resin layer formed on said surface of the wiring board in such a way as to cover the semiconductor chip;
a first recess formed on a surface of the sealing resin layer; and
a second recess which is formed on a surface of the sealing resin layer and has a greater depth from the surface than the first recess.

(Additional Note 8)

The semiconductor device as described in Additional Note 7, characterized in that the first recess is formed in a region substantially in the center of said surface of the sealing resin layer, and
the second recess is formed in the region of an end of said surface of the sealing resin layer.

(Additional Note 9)

The semiconductor device as described in Additional Note 7, characterized in that the second recess is formed in a region substantially in the center of said surface of the sealing resin layer, and
the first recess is formed in a different region than the second recess on the surface of the sealing resin layer.

(Additional Note 10)

The semiconductor device as described in Additional Note 8, characterized in that the second recess is formed as a single element along an outer edge of the surface of the sealing resin layer.

(Additional Note 11)

The semiconductor device as described in Additional Note 7, characterized in that the first recess is a mark formed on said surface of the sealing resin layer.

(Additional Note 12)

The semiconductor device as described in Additional Note 7, characterized in that the wiring board and the semiconductor chip are electrically connected by a plurality of wires, and the first recess and the second recess are formed at positions avoiding a region on the surface of the sealing resin layer positioned above the plurality of wires.

It should be noted that this application claims the benefit of priority based on Japanese Patent Application 2013-9285 filed on Jan. 22, 2013, the disclosure of which is hereby incorporated in its entirety.

KEY TO SYMBOLS 1, 20 . . . Sample
2, 21 . . . Wiring board
3, 22, 62, 102 . . . Semiconductor chip
4, 23, 41, 75, 81, 91 . . . Sealing resin layer
5, 24 . . . Solder ball
6, 25 . . . Substrate
7, 26 . . . Reference surface
8, 27 . . . Removal region
11, 31 . . . Projecting region
12, 13, 32, 33 . . . Non-projecting region
40, 60, 80, 90, 100 . . . Semiconductor device
42a, 42b, 42c, 42d, 82, 93 . . . First recess
43, 92 . . . Second recess
44 . . . Wiring board
45, 101 . . . Adhesive member
46 . . . Semiconductor chip
47, 69 . . . Solder ball
48, 68 . . . Land
49, 64 . . . Electrode pad
50, 65 . . . Connection pad
51 . . . Wire
63 . . . Underfill
66 . . . Bump
67 . . . Connection land
70 . . . Wiring motherboard
71 . . . Product formation region
72 . . . Frame section
73 . . . Dicing line
74 . . . Positioning hole

What is claimed is:

1. A method for manufacturing a semiconductor device, comprising:
   manufacturing a sample semiconductor device;
   taking a measurement value relating to curvature of the sample;
   determining a removal region constituting a region for removal from a sealing resin layer covering one surface of the semiconductor device positioned on the opposite side of a substrate when the semiconductor device is mounted on said substrate in accordance with the measurement value, wherein the removal region includes a projecting region which is a region of the sealing resin layer whereof the height from the substrate exceeds a predetermined height when the sample is mounted on the substrate; and
   manufacturing the semiconductor device, wherein manufacturing the semiconductor device comprises forming the sealing resin layer, after which the removal region is removed.

2. The method of claim 1, wherein the sample and the semiconductor device are both provided with a wiring board, a semiconductor chip and a sealing resin layer, and the wiring board, semiconductor chip and sealing resin layer of the sample and the wiring board, semiconductor chip and sealing resin layer of the semiconductor device are both made of the same materials, or are made of materials which at least have the same thermal expansion coefficient.

3. The method of claim 1, wherein manufacturing the semiconductor device comprises:
   preparing a wiring board having a plurality of product areas defined by dicing lines;
   mounting one or more semiconductor chips in each of the plurality of product areas;
   forming a sealing resin layer on the wiring board in such a way as to cover the plurality of product areas all together;
   removing the removal region from the sealing resin layer by means of laser marking; and
   separating the product into individual product areas by cutting the wiring board and the sealing resin layer along the dicing lines.

4. The method of claim 3, wherein a mark is formed by means of laser marking in each portion of the sealing resin layer corresponding to the plurality of product areas, before, after or concurrently with removing the removal region.

5. The method of claim 1, wherein the curvature is concave, and the removal region includes an outer edge of the sealing resin layer.

6. The method of claim 1, wherein the curvature is convex, and the removal region includes essentially the center of the sealing resin layer.

* * * * *